United States Patent
Brenner et al.

(10) Patent No.: US 9,673,913 B2
(45) Date of Patent: Jun. 6, 2017

(54) CIRCUIT ARRANGEMENT WITH INTERFERENCE PROTECTION

(75) Inventors: Pietro Brenner, Edersberg (DE); Edmund Götz, Dachau (DE)

(73) Assignee: Intel Deutschland GmbH, Neubiberg (DE)

( * ) Notice: Subject to any disclaimer, the term of this patent is extended or adjusted under 35 U.S.C. 154(b) by 628 days.

(21) Appl. No.: 12/778,109

(22) Filed: May 11, 2010

(65) Prior Publication Data
US 2010/0219882 A1    Sep. 2, 2010

Related U.S. Application Data

(63) Continuation of application No. 11/711,210, filed on Feb. 27, 2007, now Pat. No. 7,733,165.

(51) Int. Cl.
*H03K 5/00*    (2006.01)
*H04B 15/00*    (2006.01)

(52) U.S. Cl.
CPC .................. *H04B 15/005* (2013.01)

(58) Field of Classification Search
CPC ............. H03H 11/0422; H03H 11/04; H03H 11/1291; H03H 11/1213; H03K 5/1252
USPC .................................... 327/551–559
See application file for complete search history.

(56) References Cited

U.S. PATENT DOCUMENTS

| | | | | |
|---|---|---|---|---|
| 5,627,736 A * | 5/1997 | Taylor | ............................... | 363/39 |
| 5,726,599 A * | 3/1998 | Genest | ........................... | 327/553 |
| 6,040,730 A | 3/2000 | Ferrario | | |
| 6,344,772 B1 * | 2/2002 | Larsson | ......................... | 327/552 |
| 6,667,665 B2 * | 12/2003 | Janssen | ............................ | 331/78 |
| 6,703,884 B2 * | 3/2004 | Bosshart | ....................... | 327/295 |
| 7,733,165 B2 | 6/2010 | Brenner et al. | | |
| 2002/0084871 A1 * | 7/2002 | Fallahi | ..................... | H03H 7/06 333/168 |
| 2003/0190005 A1 * | 10/2003 | Amick | .................... | H03L 7/093 375/376 |

FOREIGN PATENT DOCUMENTS

| DE | 4228480 A1 | 3/1994 |
|---|---|---|
| DE | 19951114 A1 | 3/2001 |

OTHER PUBLICATIONS

Prosecution History, U.S. Appl. No. 11/711,210, filed Feb. 27, 2007, U.S. Pat. No. 7,733,165, including Jan. 28, 2010 Notice of Allowance and Fees Due (PTOL-85), Nov. 13, 2009 Final Rejection, Apr. 14, 2009 Non-Final Rejection, Apr. 14, 2009, Jul. 23, 2008 Non-Final Rejection, Jul. 23, 2008, Jul. 23, 2008, and Feb. 27, 2007 Information Disclosure Statement (IDS) Filed (SB/08).

* cited by examiner

*Primary Examiner* — Dinh T Le
(74) *Attorney, Agent, or Firm* — Schwegman Lundberg & Woessner, P.A.

(57) ABSTRACT

A circuit arrangement with an interference protection is disclosed, including a supply line and a ground line, a first circuit and a second circuit. Each of the first and second circuit is connected to the supply line and to the ground line. The circuit arrangement also includes a blocking device coupled to at least the supply line to suppress any interfering signals from being applied to the supply line.

19 Claims, 10 Drawing Sheets

FIG 18 Example for C-Multiplier with Current Conveyor

CIRCUIT ARRANGEMENT WITH INTERFERENCE PROTECTION

RELATED CASES

This application is a Divisional Application of co-pending application Ser. No. 11/711,210, which was filed on Feb. 27, 2007. The priority of the co-pending Application is hereby claimed and the entire contents thereof incorporated herein by reference.

BACKGROUND

Present integrated circuit, system packaging (System in/on Package (SiP/SoP)) and Package on Package (PoP)) techniques use highly modular and highly integrated devices to realize a desired application. For this purpose, different circuit blocks for signal processing are often designed and implemented in a semiconductor substrate or in compact system packages as separated integrated circuits. Such circuits may include active elements like transistors, amplifiers and diodes as well as passive elements like resistors, inductors or capacitors. Each of those circuit blocks within a semiconductor substrate or a package substrate/board is connected to power supply lines to receive supply voltage and supply current. These supply lines are often internally connected to supply devices. Such devices may comprise for example a voltage regulator, a current source, a step-up converter or the like.

Current developments indicate that the signal processing frequencies used in the different circuit blocks tend to increase to higher frequencies in the range of some gigahertz. For example, in current mobile communication technologies the RF frequencies used are in the range of 1 GHz to 5 GHz, while even the frequencies for base band signal processing lie between about 1 kHz up to several hundred MHz. To ensure signal quality and prevent errors during signal processing, any crosstalk effects between the different circuit blocks have to be minimized. Consequently, there is a desire to reduce crosstalk effects in integrated circuitry and packaged systems.

BRIEF DESCRIPTION OF THE DRAWINGS

The detailed description is described with reference to the accompanying figures. In the figures, the left-most digit(s) of a reference number identifies the figure in which the reference number first appears. The use of the same reference number in different instances in the description and the figures may indicate similar or identical items.

DETAILED DESCRIPTION

In the following description, further aspects and embodiments of the present invention are disclosed. In addition reference is made to the accompanying drawings which form a part hereof, and in which is shown a way of illustration in which the invention may be practiced. The embodiments of the drawings present a discussion in order to provide a better understanding of one or more aspects of the present invention. Some of those embodiments may include general elements of different devices having frequency-dependent signal and transmission parameters. Such embodiments shall visualize different aspects to deepen the understanding of the present invention. The disclosure is not intended to limit the features or key elements of the invention to a specific embodiment. Rather, the different elements, aspects and features disclosed in the embodiments can be combined in different ways by a person skilled in the art to achieve one or more advantages of the present invention. Further, a person skilled in the art may use variations or additional devices to realize the subject matter for which protection is sought. Therefore, it is to be understood that other embodiments may be utilized and structural or logical changes may be made without departing from the scope of the invention. The elements of the drawings are not necessarily to scale relative to each other. For illustration purposes elements are named and frequency ranges may be specified. Of course, the elements as well as the ranges are not restricted to the embodiments shown herein. Like reference numerals designate corresponding similar parts.

When realizing highly integrated circuits, different circuit blocks are connected to a common supply line. To prevent crosstalk effects, it is necessary not only to block signals with high frequencies between the different circuit blocks, but also to achieve a high suppression for interference signals coupled to the supply lines between the circuit blocks. Otherwise, interference signals from one circuit block may couple into an adjacent circuit block connected to the same supply lines, thereby causing interference and crosstalk effects. While suppressing interference signals with high frequencies, approximately above 1 GHz can be achieved using passive filters with capacitors having small values, preventing crosstalk effects with interference signals of low frequencies is also of some importance.

Those interference signals are caused by active elements of the circuit blocks, which produce intermodulation products in operation. For example, a circuit block processes a first signal at 1 GHz and a second signal at some other frequency, intermodulation and mixing products may occur due to non-linear effects of some active transistors. These mixing products may include signal components at frequencies in the range of less than 100 MHz to some GHz. Some of these signal components are easily coupled into the supply lines connected to the transistors, thereby causing interference signals and crosstalk on the supply voltage or current. Of course, the interference signals on the supply voltage may cause additional interference and undesired effects in adjacent circuits. Moreover, even a power supply circuit providing supply voltage or supply current to the supply lines may also generate low frequency, undesired interference signals on the supply line.

All of these signals have to be suppressed as well to ensure a proper power supply for the circuit blocks connected to the supply lines.

To achieve a sufficient blocking even at low frequencies, one has to realize capacitance with very high values or elements with a high admittance values, respectively. For example, the integration of passive C or L-elements requires a high chip space in the range of 0.5-5 fF/$\mu m^2$ for capacitors.

In one embodiment, the circuit arrangement with a signal interference protection comprises at least one supply line and at least one ground line, and a first circuit and a second circuit connected to the at least one supply and ground lines. In operation both circuits are supplied via the at least one power and ground line. To suppress and prevent major crosstalk effects between the first and the second circuit a protective circuit is disposed and coupled to the at least one supply and the ground line. The protective circuit suppresses interfering signals caused by the second circuit on at least one of the supply and the ground line being applied to the first circuit.

In another embodiment, a blocking device coupled to a power line of a circuit arrangement is disposed to suppress interfering signals on the power supply line caused by at least one circuit of a first and a second circuit during their operation. Those interfering signals have at least one frequency. Consequently, the blocking device comprises a transmission minimum at those frequencies. As a result, interfering signals from the first to the second circuit or from the second to the first circuit are blocked by the device.

In a further embodiment, a circuit arrangement with a blocking device comprises a first circuit block in a first clock domain and a second circuit block in a second clock domain. Each of the first and second circuit blocks are coupled to a power supply line. Further, a blocking device is coupled to the power supply line to suppress signals generated by one circuit block of the first and second circuit block from interference with the other circuit block.

The consequent blocking of interference signals on the power and ground supply line reduces variations on a supply voltage or supply current and improves signal processing in adjacent circuit blocks.

In one embodiment of the invention, the protective circuit or the blocking device respectively comprises an element having an admittance characteristic having a predetermined value or range of values in a first frequency range. The protective circuit and blocking device also may comprise a transformation circuit coupled to the element to transform the admittance characteristic in at least a second frequency range. In this embodiment of the invention, the transformation circuit allows significant blocking of interference signals in a second frequency range, for which the element alone is not sufficient or convenient. More particularly, the second frequency range may be lower than the first frequency range. In such an embodiment of the invention, the element may comprise a filter characteristic with a cut-off frequency, which may be shifted to a different cut-off frequency by the transformation circuit.

In a further embodiment of the invention, the blocking device or the protective circuit respectively may comprise a multiplier circuit coupled to an element having a reactance or admittance. For example the element may comprise a capacitor or an inductor having a capacitance value or induction value respectively. By coupling the element to the multiplier circuit, the capacitance of the element is multiplied, thereby effectively increasing the overall virtual capacitance value. As a result, the admittance or reactance of the elements is shifted. In a further embodiment, the protective circuit may comprise a negative impedance converter. All of those devices are able to change the overall capacitance value of an element forming part of a filter, thereby effectively shifting the cut-off frequency of the filter to a different frequency range. The use of a multiplier circuit or a negative impedance converter allows realizing a blocking device capable of suppressing interference signals having very low frequencies with a small chip size.

In one embodiment of the invention, the first circuit comprises a voltage supply circuit connected to the supply line or the ground line. By arranging a protective circuit or blocking device between the voltage supply circuit and the circuit block also connected to the voltage supply line and the ground line, crosstalk effects and interfering signals from the second circuit blocks are prevented from being applied to the voltage supply circuit. In addition, any interfering signals caused by the voltage supply circuit or already included in the external supply applied to the voltage supply circuit are suppressed and prevented from being applied to the corresponding circuit blocks.

In yet another embodiment of the invention, the voltage supply circuit comprises a DC-DC converter circuit. In another embodiment, the first circuit may comprise a voltage regulator having a differential amplifier coupled with its output to a gate terminal of a regulating transistor. The regulating transistor is arranged between an external supply terminal and the supply line.

In some applications it might be useful if the circuit blocks and the blocking device can be selectively activated or deactivated, respectively. For this purpose the circuit blocks as well as the blocking device may comprise a control terminal for receiving an activation signal. In different aspect the protective circuit or blocking device comprises a supply input to receive a supply signal from an external power supply terminal. Such arrangement ensures a proper blocking functionality, because the protective circuit is now supplied independently from the main power and ground line.

Figure 1:
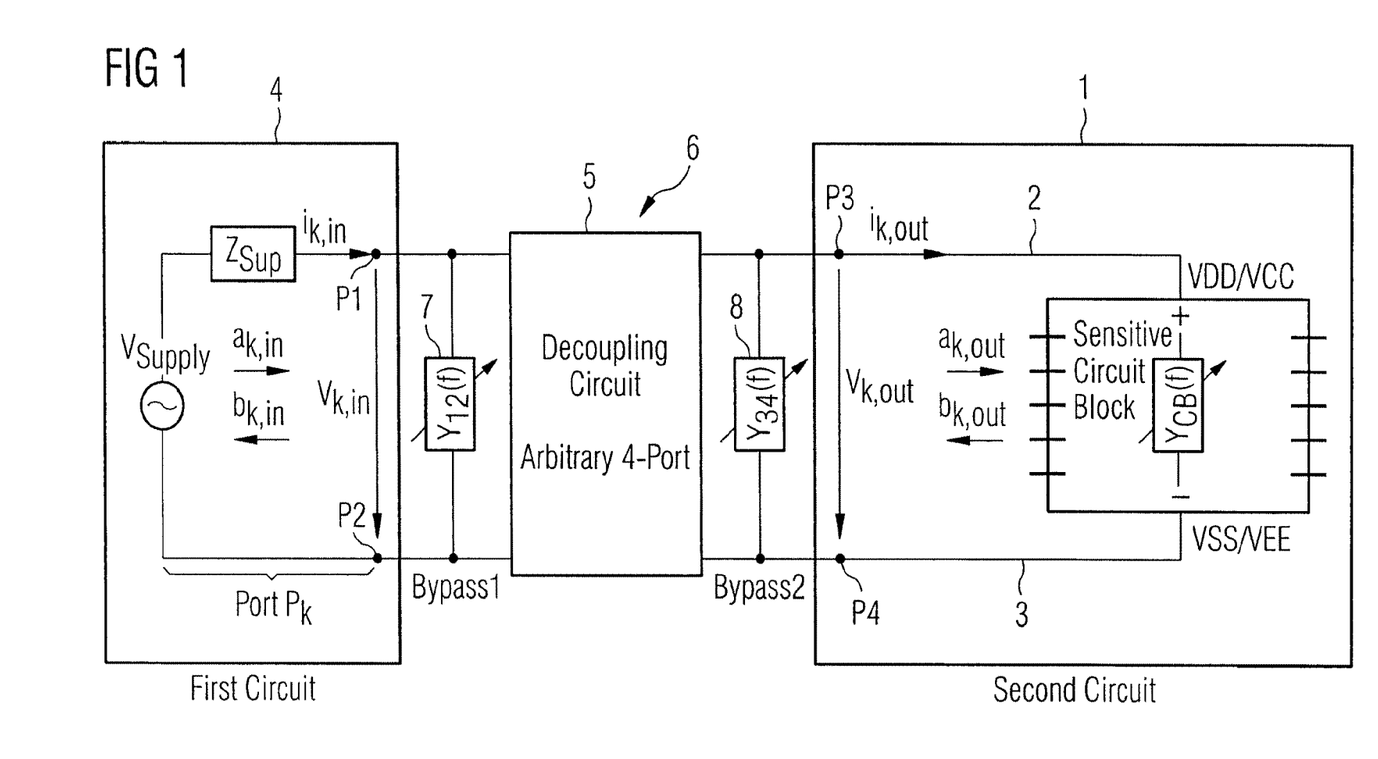
FIG. 1 shows a general view of a first embodiment of the present invention.

FIG. 1 shows a general illustration of an embodiment representing some aspects of the present invention. The circuit arrangement comprises a circuit block 1, which is sensitive to some crosstalk effects and interference signals. The circuit block 1 is supplied by a supply voltage and supply current and consequently connected to a supply line 2 and a ground line 3. A supply potential VDD or VCC respectively is supplied to the supply line 2 while the ground line 3 carries the reference potential VSS or VEE. It is clear for a person skilled in the art that a supply voltage is the difference between two potentials, one of them referred to as the reference potential. Consequently, in one embodiment the supply line is loaded with a supply potential, while the ground line is at the reference potential.

The sensitive circuit block 1 comprises active elements like, for example, diodes or transistors forming amplifiers, mixers and the like. Further passive elements like resistors, inductors and capacitors are included as well in one embodiment. Each of the elements within the circuit block 1 comprises a frequency dependent behavior. In summary, the sensitive circuit block 1 comprises a frequency-dependent admittance. The admittance of a circuit block or a circuit element is defined as the ratio of the phasor current through the block or element to the phasor voltage across the block or element. During operation, the sensitive circuit block processes signals and may produce intermodulation products and undesired signals. These are called interfering signals or crosstalk effects. The interfering signals may couple onto the power line 2 or the ground line 3, respectively. Further some AC signals on the power or ground line my couple into the sensitive circuit, and produce undesired interference during signal processing.

Also connected to the power and the ground line 2 and 3 is a voltage supply circuit 4. The voltage supply circuit 4 includes a voltage supply $V_{supply}$ as well as some elements having impedance $Z_{sup}$. The voltage supply circuit 4 provides a supply voltage and a supply current on the ground and supply lines between the output terminals P1 and P2. During operation, the interfering signals caused by the circuit block 1 can crosstalk on the supply block 4 and influence its behavior.

To prevent such interference, a blocking device 6 is disposed between block 4 and 1. The output terminals P1 and P2 represent two ports of a 4-port decoupling circuit 5. The decoupling circuit 5 in one embodiment comprises an arbitrary 4-port noise rejection filter and is part of the blocking device 6. The blocking device 6 further comprises a first bypassing network 7 arranged between the first two ports P1 and P2, and a second bypassing network 8 arranged between ports P3 and P4 respectively. Both bypassing networks 7 and 8 comprise a frequency-dependent admittance. While in this embodiment the blocking device 6 comprises a decoupling circuit 5, and two bypassing networks 7 and 8, the decoupling network is not required. Consequently, in one embodiment the blocking device 6 may comprise only the two bypassing networks 7 and 8. This may be sufficient to block undesired signal portions on the ground and the supply line.

To isolate the circuit blocks 4 and 1 from each other to prevent interfering effects, the bypassing networks 7 and 8 comprise a high-pass filter characteristic. More particularly, the admittance of the bypassing networks 7 and 8 decreases at lower frequencies. Such bypassing networks can be achieved in one embodiment by implementing a small capacitor in the range of some 100 fF to 100 pF. The capacitance is connected to a capacitance multiplier circuit for example, multiplying the capacitance of the capacitor by a respective value. Such blocking device having a capacitor whose capacitance is multiplied by a corresponding multiplier circuit comprises a virtual enlarged capacitance and allows the efficient and space saving implementation of a blocking device.

Consequently, in a more general approach a blocking device is realized by transforming the complex admittance or impedances from a first frequency range to a second frequency range by use of suitable multiplier or transformation circuits. The sensitive circuit block 1 according to FIG. 1 may cause interference signals on the supply lines at very low frequencies due to intermodulation and mixing products during signal processing. To suppress such low frequency signals, one may use for example a low-pass filter having a very low cut-off frequency.

However, such low-pass filters realized with passive elements require capacitors and inductors of relative huge chip size. Such arrangements increase the overall chip size and costs. To reduce the required chip size and nevertheless achieve a sufficient suppression, it is proposed to arrange additional multiplier circuits or negative impedance converters for increasing an overall capacitance, resulting in an enlarged virtual capacitance. Using suitable multiplication and transformation circuits transform the complex admittance or impedance characteristics of the used capacitors and inductors to different characteristics. A value X or a range with some specific values in the frequency-dependent characteristics is shifted by the transformation circuit to a different frequency range according to one embodiment, where the value may comprise an extreme value Y.

Such multiplier circuits generally may comprise a capacitance multiplier, an inductance multiplier, a negative impedance converter or more general admittance and impedance transformation circuits. A Low-pass filter realized with such circuits has a lower cut-off frequency compared to low-pass filters implemented only with passive elements. Especially for very low frequencies below 50 MHz, very efficient on chip blocking structures can be realized.

Figure 2:
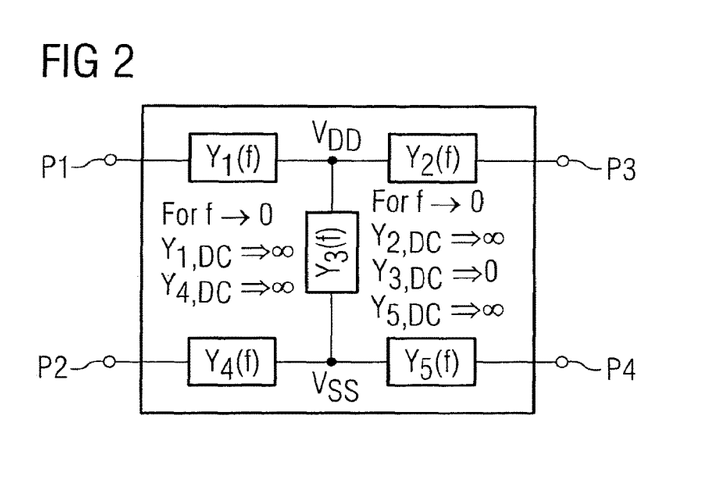
FIGS. 2 to 7 possible embodiments for a blocking device to suppress interference signals.

FIGS. 2 to 7 illustrate different embodiments of a 4-port blocking device with a representation of the corresponding frequency-dependent admittances $Y_{ij}$. For example, the admittances Y1, Y2, Y4 and Y5 of the blocking device according to FIG. 2 are increasing rapidly, while the admittance Y3 decreases towards 0 if a DC current supply to the input ports P1 to P4. For all these embodiments of a blocking device, the admittances between the ports P1 and P3 or P2 and P4 employ a very low DC resistance.

To achieve its purpose under the above mentioned conditions, further different embodiments are possible and contemplated by the present invention. For example in the embodiment according to FIG. 4, ports P2 and P4 are connected directly while two different admittances $Y_1$, $Y_2$ are arranged between ports P1 and P3. These admittances are decreasing at increasing frequencies, while the third admittance $Y_3$ arranged between line VDD and VSS is increasing with higher frequencies.

Figure 3:
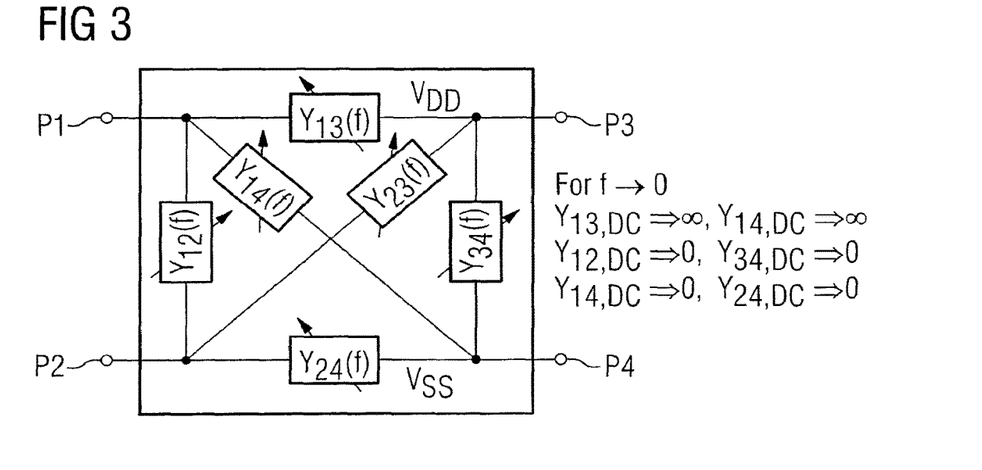
Figure 4:
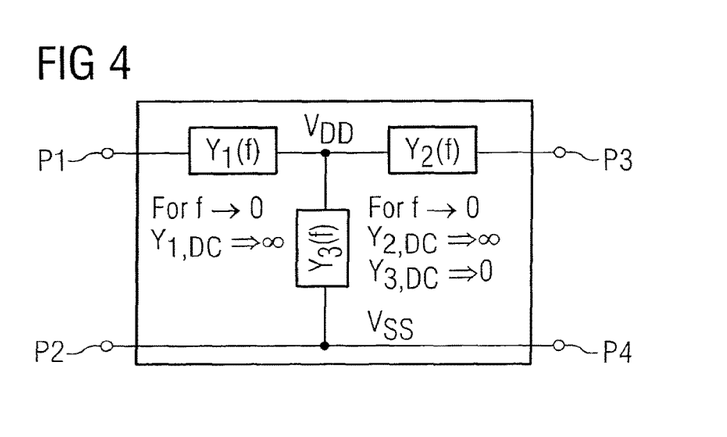
Figure 5:
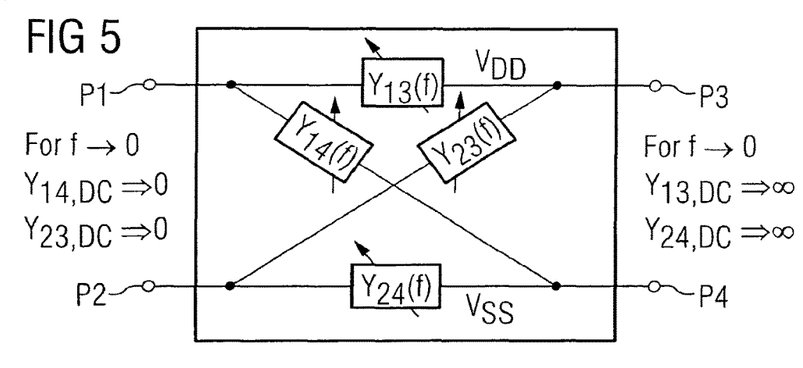

It is also possible to couple ports P1 to P4 and P3 to P2, respectively. Such arrangement is shown in FIG. 3 and FIG. 5. In addition to the embodiment of FIG. 5, two further admittances are arranged between ports P1 and P2, and P3 and P4 respectively. According to FIG. 3, the couple admittances $Y_{13}$ between ports P1 and P 3 on the supply line and $Y_{24}$ between ports P2 and P4 on the ground line increase at decreasing frequencies. Consequently, the admittance $Y_{12}$, $Y_{34}$ between ports P1 and P 2, and P3 and P4 decrease with decreasing frequencies. The same behavior shall apply for admittances $Y_{14}$ and $Y_{23}$.

Figure 6:
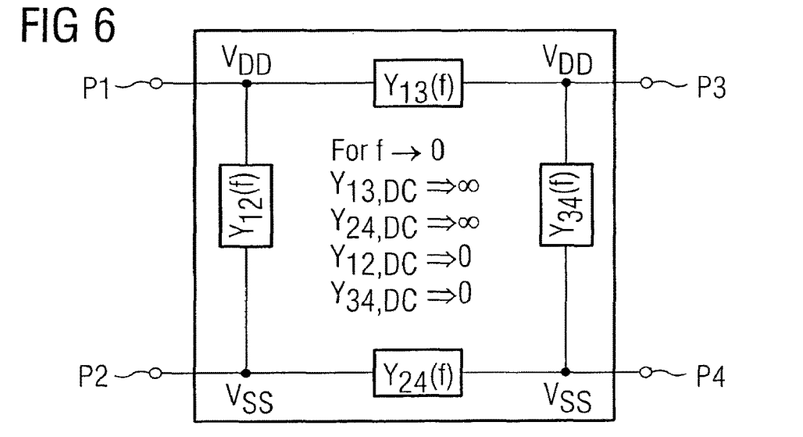
Figure 7:
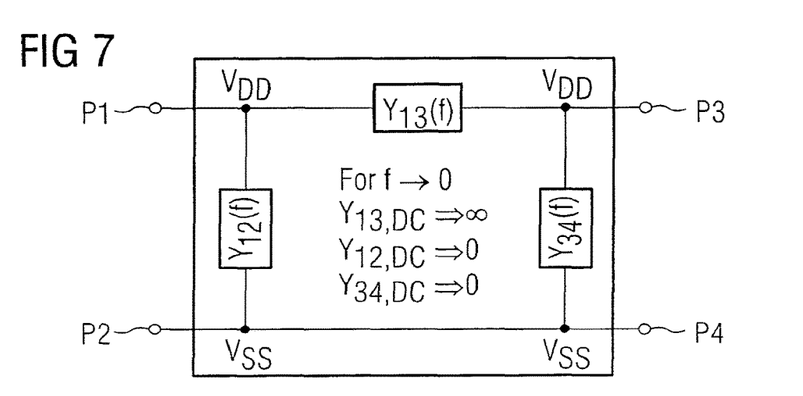

If for example, the interference signal occurs only on the supply lines and is to be suppressed between ports P1 and P3 the general embodiment according to FIG. 6 with admittances $Y_{24}$ between port P2 and P4 can be simplified to the embodiment according to FIG. 7.

Figure 8:
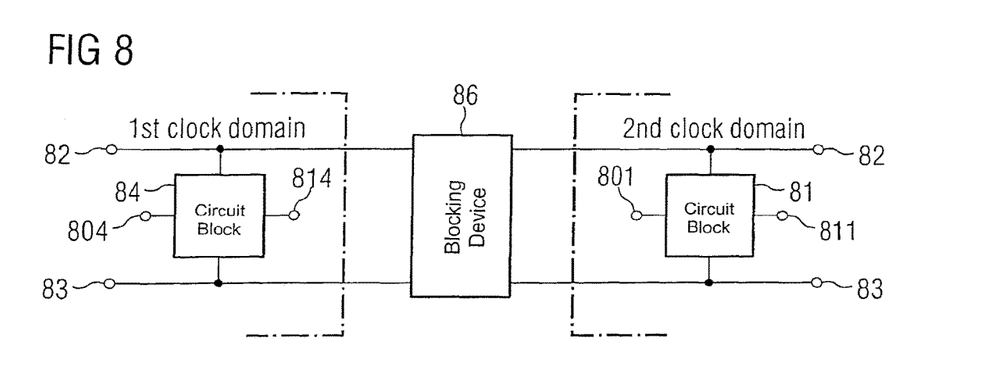
FIG. 8 shows a first embodiment of a circuit arrangement including a blocking device between two circuit blocks.

FIG. 8 shows a schematic representation with a blocking device 86 preventing interference signals caused by a first circuit 84 in a first clock domain from being applied to a second circuit 81 in a second clock domain. This application is particularly suitable for a digital signal processing application and more particularly for digital circuit blocks 81 and 84, respectively. Both circuit blocks 81 and 84 are arranged in different clock domains and connected to a common power supply line 82 and a common ground line 83. Each of the digital circuit blocks 81 and 84 comprise a clock input terminal 801, 804 respectively and a corresponding output terminal 811, 814. A clock signal is supplied at the respective clock input terminals 801, 804 of each digital circuit blocks. The clock signal is used for digital signal processing, thereby causing some interference signals or modulation products on the supply or ground line and the respective supply signals.

To ensure a proper signal quality at the output terminals of each digital circuit block, a blocking device 86 is provided to decouple all circuit blocks in each clock domain from each other. More particularly, the blocking device 86 suppresses interference signals caused in the first clock domain on the supply line and the ground line from being applied to the supply and ground line of the second clock domain. To ensure that even a low frequency interference signals are sufficiently suppressed the blocking device 86 may comprise a multiplier circuit for multiplying a capacitance of a blocking capacitor or a blocking inductor.

Figure 9:
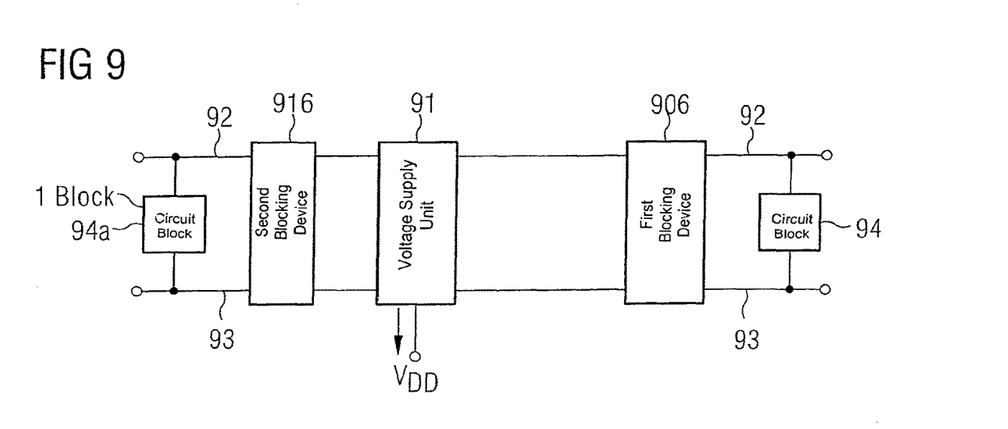
FIG. 9 shows a second embodiment including blocking devices to suppress interference signals between adjacent circuit blocks.

FIG. 9 shows another embodiment of a circuit arrangement. The circuit arrangement comprises a voltage supply unit 91 coupled to an external voltage supply terminal VDD. The voltage supply unit 91 provides a supply voltage and a supply current. The unit is connected to a power supply line 92 and a ground line 93. In this embodiment, the supply unit 91 is sensitive to interference signals on the ground or the supply lines. Consequently, a first blocking device 906 and a second blocking device 916 are provided. The first blocking device 906 comprises a low-pass filter characteristics with a first cut-off frequency, adapted to suppress any interfering signals caused by the circuit block 94 on the supply or ground line. The cut-off frequency of the first blocking device 906 is chosen to be lower than the lowest frequency of the interference signal generated by the circuit 94. A second blocking device 916 having filter characteristics with a second cut-off frequency is disposed to prevent any interference signal from the circuit block 94 *a* being applied to the supply unit 91.

Figure 10:
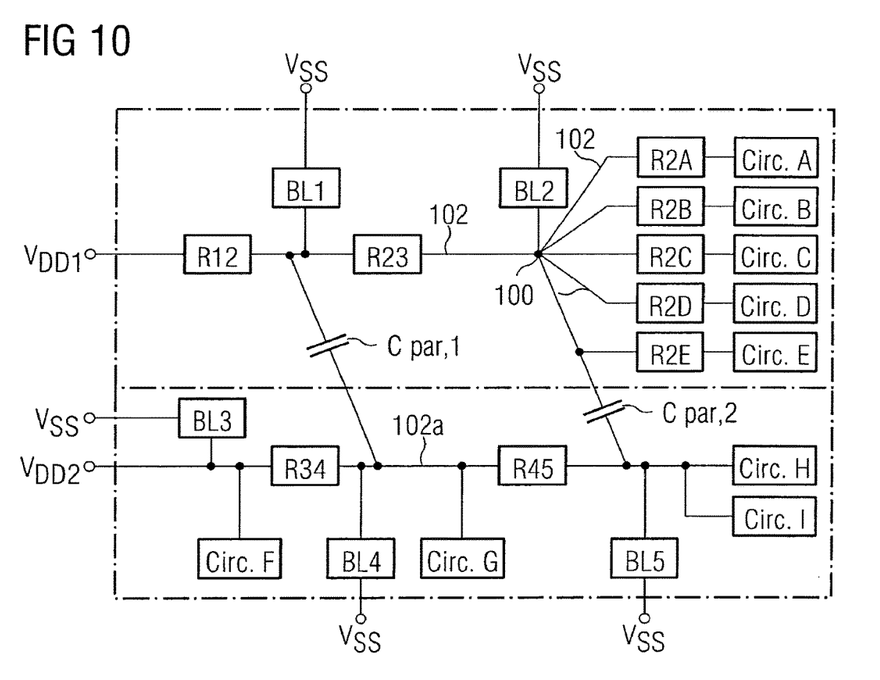
FIG. 10 shows an embodiment with different blocking devices and circuit blocks to suppress interference signals and crosstalk effects.

A more complex embodiment is shown in FIG. 10, also demonstrating blocking techniques to prevent crosstalk effects between different supply areas. In this embodiment, a chip with semiconductor substrate comprises a plurality of integrated circuit blocks Circ.A to Circ.I for signal processing. The blocks are supplied with voltage and current. However two different supply areas are provided within the chip, because the different blocks may require different supply voltages. A first plurality of circuit blocks Circ.A to Circ.E are supplied by first supply voltage VDD1. The first supply voltage is applied at a terminal which is connected to a power line 102. The power line 102 comprises some resistance, which is represented by the resistor elements R12 and R23. At node 100, a so called star like node, the supply line is split up into different supply lines each of them comprising a resistance represented by a resistive element R2A to R2E. The supply lines are connected to the respective circuit blocks Circ.A to Circ.E. Each of those circuit blocks perform some signal processing in operation with different signal frequencies and power consumption.

In addition, a serial power supply routing is provided in the lower part connecting the circuit blocks Circ.F to Circ.I to a supply line 104. A second supply voltage VDD 2 is applied to the second supply line 104. Once again, the second supply line comprises an electrical resistance, represented by the resistive elements R34 and R45.

Each of the power supply lines can be modeled as an RL-element tree. At important nodes along the supply line blocking devices BL1 to BL5 according to the proposed embodiments are placed. They can stabilize the power supply. Further they suppress and bypass any parasitic spurious signals between the supply lines 102 and 104. As an example, two parasitic capacitors $C_{par,1}$ and $C_{par,2}$ are illustrated herein by way of example. Each of the blocking devices BL1 to BL5 is connected to the ground terminal VSS and the respective supply lines 102 and 104. They may comprise similar elements to realize the same cut-off frequency or even different elements depending on the application. For example, the blocking device BL1 and BL4 may comprise elements for a similar blocking characteristic, while blocking device BL3 comprise a different blocking characteristic to suppress any interference signal from being applied to the external power supply terminal for the second supply voltage VDD2.

Figure 11:
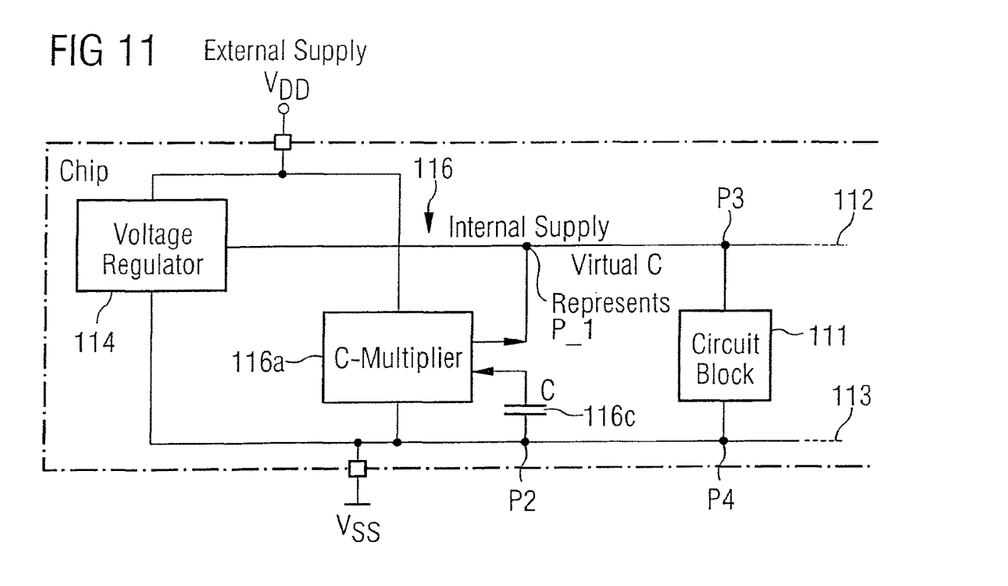
FIG. 11 shows a further embodiment with a blocking device to prevent crosstalk effects between a supply circuit and a circuit block.

FIG. 11 shows an embodiment of the first circuit block 111 and a second circuit block 114 including a blocking device 116 arranged between. In one embodiment, the blocking device 116 comprises a capacitor multiplier 116*a* connected with its power supply terminals to an external supply VDD and to the ground terminal VSS. The multiplier circuit 116*a* comprises a first input terminal connected to a first capacitor 116*c* and an output terminal connected to the internal supply line 112. A second terminal of the capacitor 116 *c* is connected to the ground line 113.

Also arranged between the internal supply line 112 and the ground line 113 is a first circuit block 111. As one can see the connection of the output terminal of the capacitor multiplier 116 *a* represents a first port P1. Accordingly, the second terminal of capacitor 116*a* represents the second port terminal P2, while the terminals P3 and P4 are corresponding to the connection of the circuit block 111 with the internal supply line 112 and the ground line 113.

For providing a supply voltage and supply current a voltage regulator circuit 114 is arranged between the external supply terminal VDD and the ground terminal VSS as an integrated circuit within the semiconductor substrate. The voltage regulator 114 comprises an output connected directly to the power supply line 112. The blocking device 116 suppresses any interfering signal from the voltage regulator 114 or the circuit block 111 from being applied to each other. Because a blocking admittance Y between port P1 and P2 is proportional to the capacitor value of the capacitance 116*c*, the multiplication of the capacitance of capacitor 116*c* with the capacitance multiplier results in a virtual capacitance much higher than the real capacitance value of element 116*c*. Consequently, the higher virtual capacitance also results in a sufficient blocking admittance even for interfering signals at lower frequencies.

Figure 12:
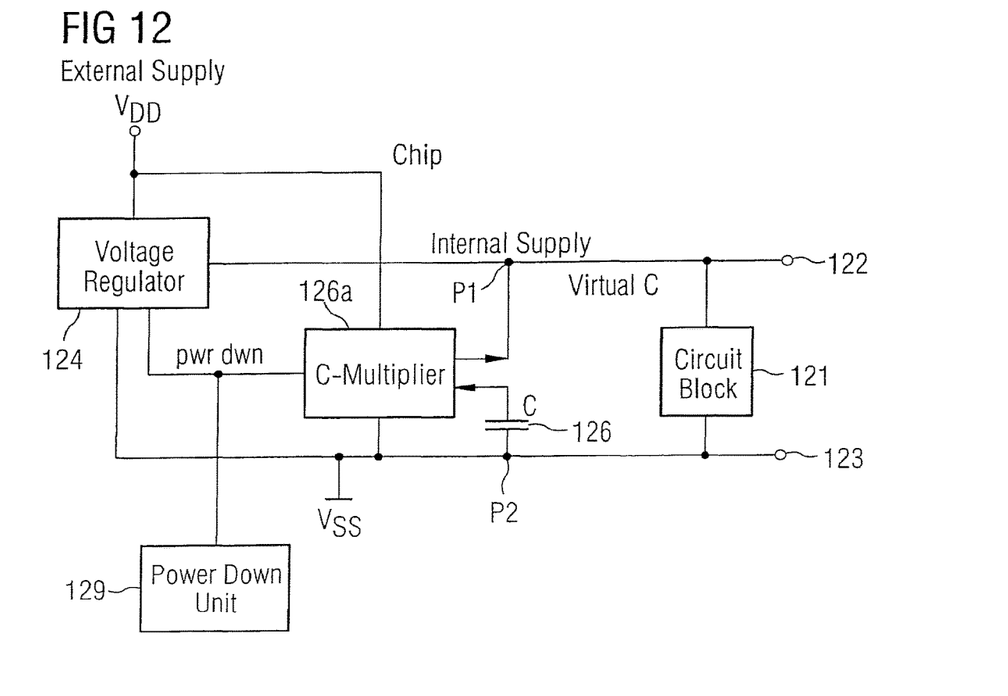
FIG. 12 shows a further embodiment of the circuit arrangement.

FIG. 12 shows a similar embodiment in which the voltage regulator as well as the capacitance multiplier 126*a* of the blocking device each comprises a control terminal for receiving a power down signal. The power down signal is provided by a power down unit 129 upon activation or de-activation of the integrated circuit. For some application, it might be useful only to de-activate the capacitance multiplier of the blocking device to decrease overall power consumption.

Figure 13:
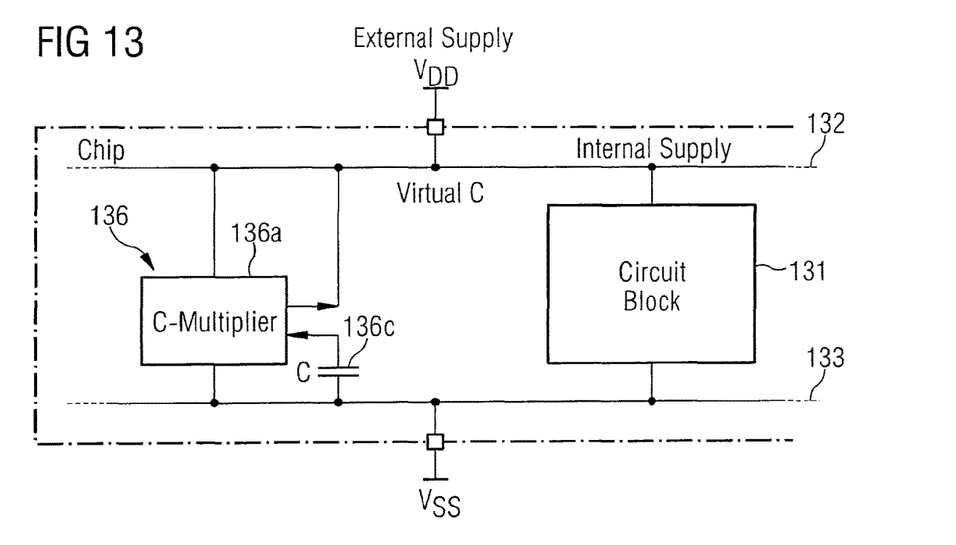
FIG. 13 shows an embodiment of a circuit arrangement with a blocking device between a supply and a ground line.

In a similar embodiment, the blocking device can also be connected directly to the external supply terminal. Such an embodiment is illustrated in FIG. 13. In this embodiment, the multiplier circuit 136*a* is connected to the internal supply line 132 and the internal ground line for it own power supply. In addition, the internal supply line is coupled directly to the external power supply terminal VDD. In operation the capacitance multiplier 136*a* multiplies the capacitance of the connected capacitor 136*c* and therefore transforms the complex admittance of the capacitor 136*c* to a different frequency range. In other words, the multiplier circuit shifts the cut-off frequency of the element 136c to a lower frequency. If the circuit block 131 or other blocks connected to the internal power lines 132, 133 are causing interfering signals on the power lines, the signals are blocked from being applied to the external supply terminal VDD. Interference signals with very low frequency can now be suppressed by the virtual capacitor of the blocking device 136.

Figure 14:
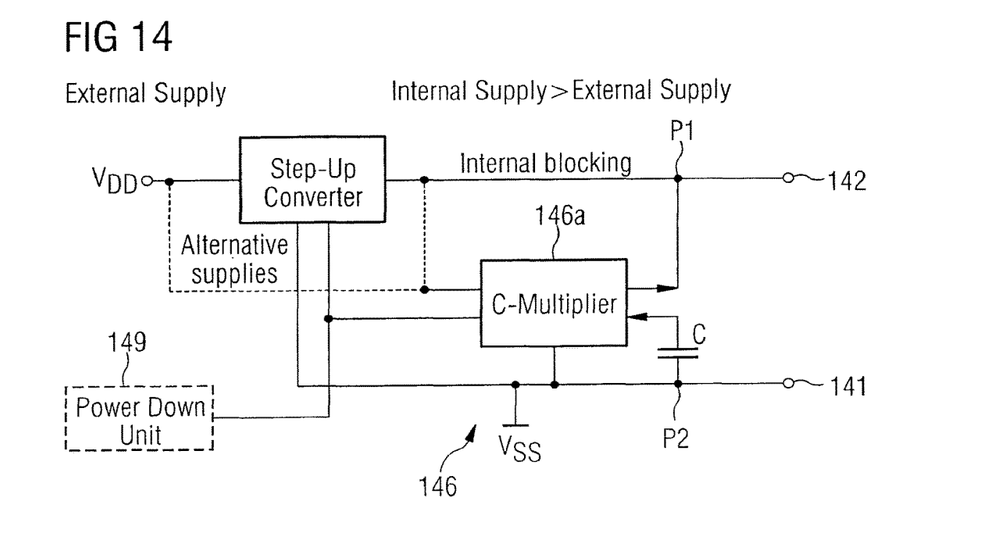
FIG. 14 shows an embodiment with a step-up converter as a first circuit.

FIG. 14 shows a different embodiment using a Step-Up converter for power supply of the internal supply line 142 and the ground line 141. The Step-Up converter converts an external supply voltage at terminal VDD to an internal supply voltage at terminals 141 and 142. The converted voltage is higher than the supply voltage applied to terminal VDD. Further, a power down unit 149 is provided connected to corresponding control terminals of the Step-Up converter and the capacitance multiplier of the blocking device 146. Because the capacitance multiplier 146A is an active device having additional transistors, the multiplier has to be connected to the supply voltage. For this purpose, the embodiment according to FIG. 14 shows two alternative supply connections.

In one alternative embodiment, the capacitance multiplier 146a is connected directly to the external supply terminal VDD. A direct connection can be used if the capacitance multiplier requires a supply voltage smaller than the voltage generated by the Step-Up converter. In the other alternative embodiments, the capacitance multiplier is connected directly to the output of the Step-Up converter thereby receiving the supply signal from the converter. Again, the Step-Up converter as well as the multiplier 146a of the blocking device can be activated and deactivated separately.

For some applications two different step-up converters may be used to generate a positive power supply voltage as well as a negative power supply voltage. For the latter a Step-Down converter instead of a Step-Up converter is used.

Figure 15:
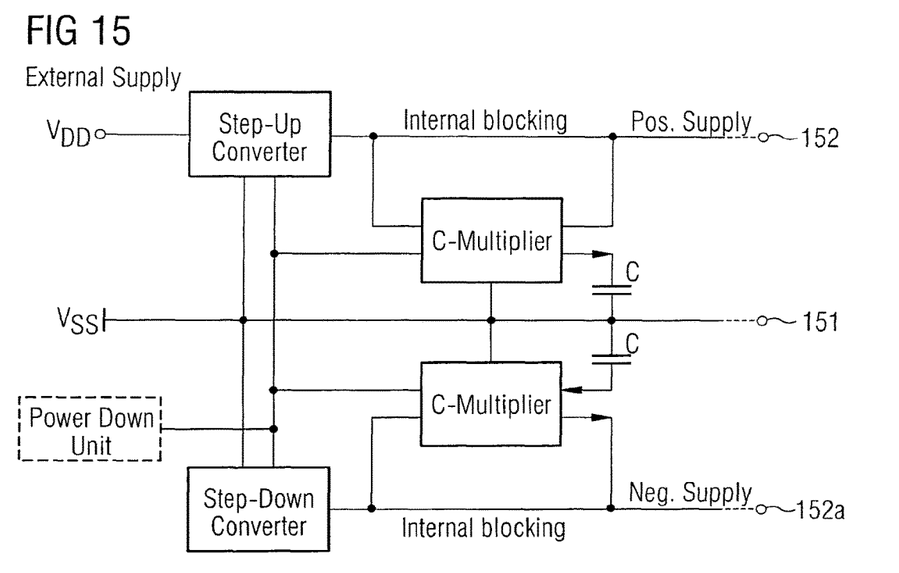
FIG. 15 shows an embodiment with two blocking devices preventing crosstalk on a negative and positive power supply line.

FIG. 15 shows a corresponding embodiment which includes a blocking device having two capacitance multipliers connected to respective blocking capacitors C. One arrangement of a multiplier and a corresponding capacitor connected thereto is arranged between the ground line 151 and the positive power supply line 152. The second capacitance multiplier and capacitor is disposed between the ground line 151 and the negative power supply line 152a. The multipliers for both blocking devices are connected with their respective supply terminals to the output of the corresponding converter. In addition, the Step-Up converter, the Step-Down converter as well as both multipliers comprise control terminals to receive the activation signal from the power down unit.

Figure 16:
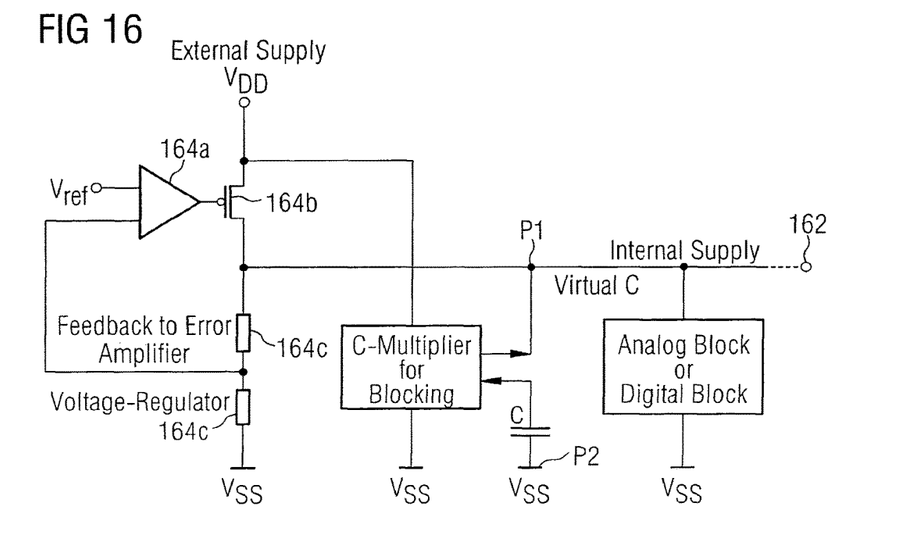
FIG. 16 shows an embodiment with a first block comprising a voltage regulator.

FIG. 16 shows an embodiment for a voltage regulator circuit having an operational amplifier 164a with a first input terminal to receive a reference potential Vref. The voltage regulator further comprises a regulating transistor 164b connected with its gate terminal to the output of the operational amplifier 164a. While one terminal of the regulating transistor is connected to the external supply terminal VDD, the second terminal is coupled to the internal supply line 162 and to two resistors 164C and 164D connected in series. Between the two resistors a node is connected to a second input terminal of the operational amplifier 164a for a feedback.

Figure 17:
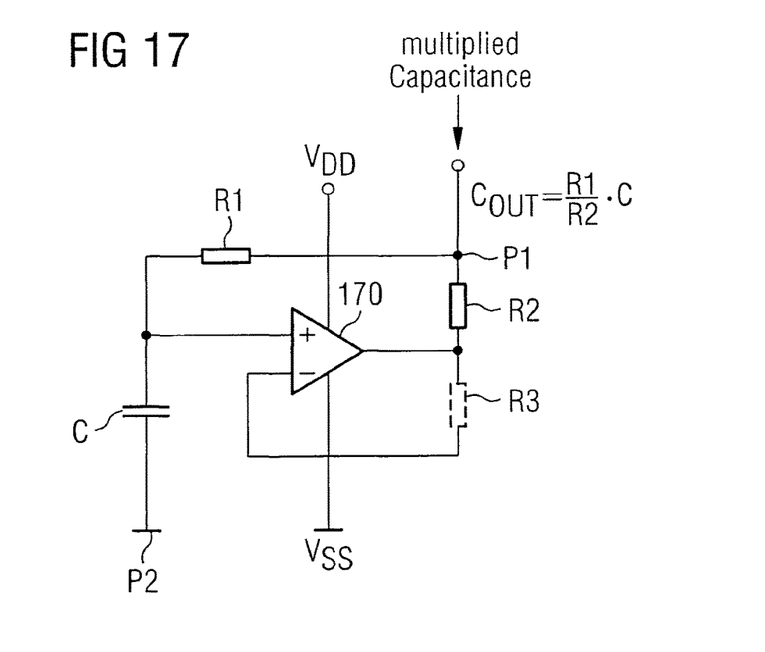
FIG. 17 shows an exemplary embodiment of a capacity multiplier circuit.

For a capacitance multiplier, different embodiments can be used. As a non-limiting example FIG. 17 shows a capacitance multiplier comprising an operational amplifier 170 with a feedback path. At the output terminal P1 the capacitance $C_{out}$ generated by the multiplier and derived from the input capacitance C is derived by the formula $C_{out}=R1/R2*C$, wherein R1 and R2 are the respective resistance values of the resistors R1 and R2. The operational amplifier 170 comprises a first input terminal "+" connected to the capacitor C, whose capacitance is to be multiplied. The capacitor C corresponds to the capacitor of the blocking device as shown in the above illustrated embodiments. The first input terminal of the operational amplifier 170 is also connected to its output via a first resistor R1 and a second resistor R2. The output has a feedback to a second input terminal "−" of the amplifier 170 as well. Between the two resistors R1 and R2 a node is connected to the output, also representing port P1.

Figure 18:
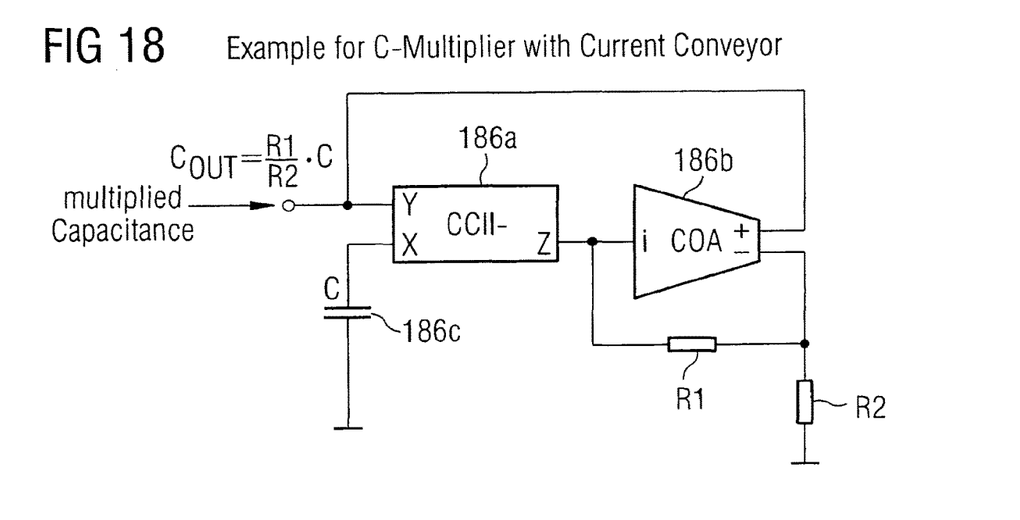
FIG. 18 shows an exemplary embodiment for a capacity multiplier with current conveyor.

A multiplier circuit for a capacitor using a current conveyor is shown in FIG. 18. A current conveyor is a special embodiment of an amplifier, particularly useful whenever current at very low impedances have to be amplified. In this embodiment, the current conveyor 186a is a so called second-generation conveyor, which is a more versatile device. Generally speaking, the current conveyor can be considered a "double-follower" in that it can form a voltage or current follower. However a different current conveyor or even a transimpedance amplifier can be used as well for a multiplication circuit according to the invention. For a capacitance multiplication, the current conveyor is connected with its output terminal Z to an input terminal i of a current based operational amplifier 186b. In addition, the output terminal Z and the input terminal i are connected via a first resistor R1 and a second resistor R2 to the ground line VSS. A node between the resistors R1 and R2 is connected to a first output terminal "−" of the current based amplifier 186b. A second output terminal "+" of the current controlled amplifier 186b provides the desired multiplied capacitance and is connected to a first input terminal Y of the current conveyor 186a. The second input terminal X of the current conveyor is connected to the capacitance 186c to be multiplied.

Figure 19:
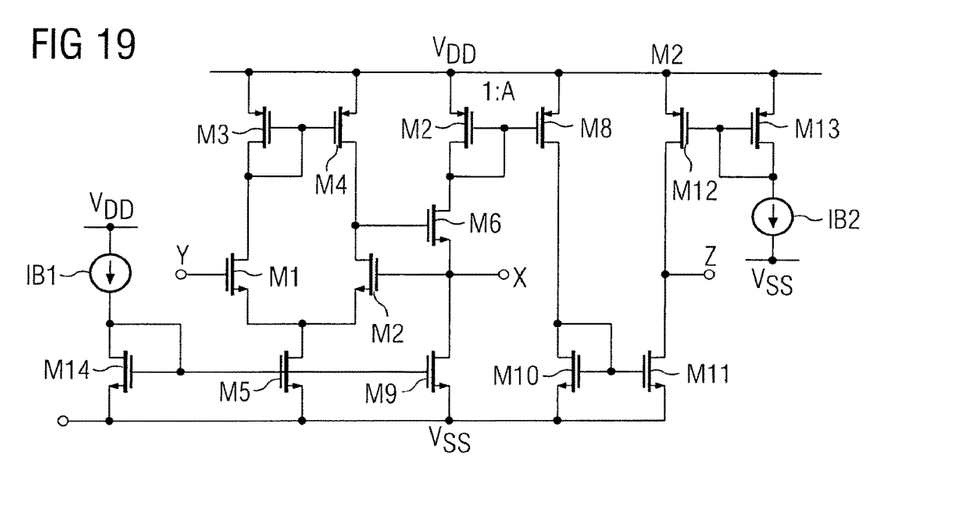
FIG. 19 shows an embodiment of a current conveyor usable for capacitance multiplication according to the current conveyor on FIG. 18.

An embodiment of the negative current conveyor of the second-generation according to FIG. 18 is shown in FIG. 19. The current conveyor comprises a first differential amplifier having the transistors M1 and M4 connected with their drain terminals to a first current mirror of transistors M3 and M4. The gate terminal of the first transistor M1 is coupled to the first input terminal Y while the gate terminal of the second transistor M2 represents the second terminal X of the current conveyor.

For biasing, the differential amplifier is connected to a bias transistor M5 which forms a part of a current mirror with transistor M14 connected to a bias unit IB1. The transistor M5 is also the current source for the amplifier. The drain terminal of transistor M2 of the differential amplifier is connected to a gate terminal of a transistor M6. The transistor M6 itself is arranged between a further current mirror of transistors M7 and M8 and the second input terminal X. Introducing the transistor M 6 reduces the minimum operating supply voltage. The current mirror of transistors M7 and M8 mirrors the output signal of the differential amplifier in the ratio 1:A. To achieve the negative current conveyor, the structure further comprises an additional current mirror with transistors M10 and M11, whose second terminal of transistor M11 is connected to output Z of the current conveyor. A current mirror of transistors M12 and M13 are biasing the output current.

Figure 20:
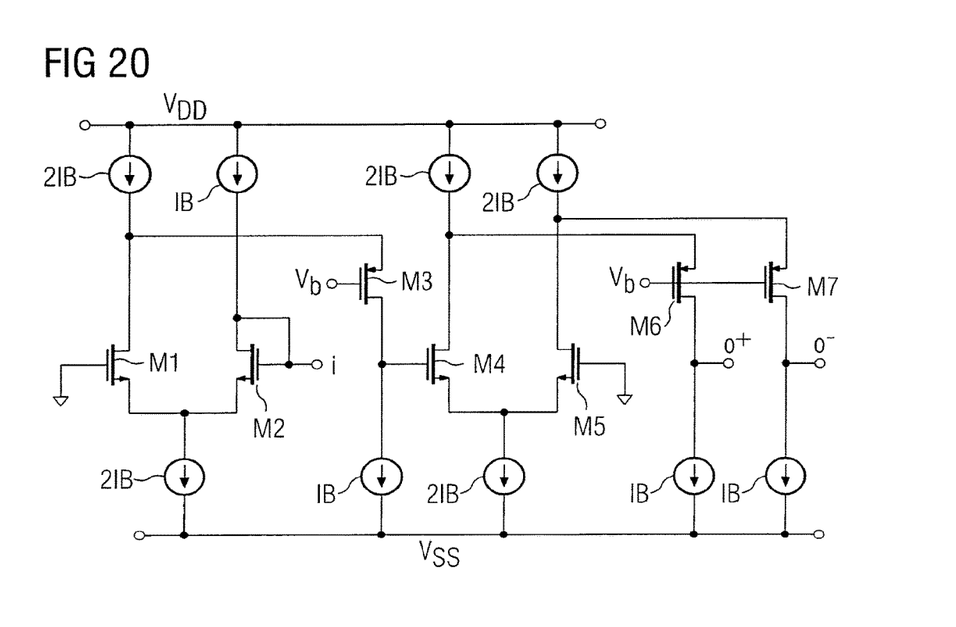
FIG. 20 shows an embodiment of a current controlled amplifier according to the embodiment of FIG. 18.

FIG. 20 shows a current controlled operational amplifier (COA) with field-effect transistors according to one embodiment. The current controlled amplifier comprises a first differential amplifier with an input terminal I connected to the gate and drain of a first transistor M2. Together with a second transistor M1 the transistor M2 form the first differential amplifier. The output of the first differential amplifier between the drain of transistor M1 and a current source 21B is connected to a transistor M3 biased by a voltage VB. The transistor M3 is connected to an input terminal of a second differential amplifier comprising the transistors M4 and M5, respectively. Each output terminal of the second differential amplifier is connected to a first terminal of a source follower comprising the transistors M6 and M7. The second terminals of the transistors M6 and M7 are coupled to the output terminals "+", "−" of the current based operational amplifier. As also seen in FIG. 20, current sources are arranged in the different branches of the amplifier providing the corresponding currents IB.

Although specific embodiments have been illustrated and described, it will be appreciated by one of ordinary skill in the art that any arrangement which is calculated to achieve the same purpose may be substituted for the specific embodiment shown. It is to be understood that the above description is intended to be illustrative and not restrictive. The application is intended to cover any variations of the invention. The scope of the invention includes any other embodiments and applications in which the above structures and methods may be used. The scope of the invention should therefore be determined with reference to the appended claims along with the scope of equivalence to which such claims are entitled.

It is emphasized that the abstract is provided to comply with 37 CFR. Section 1.72(b) requiring an abstract that will allow the reader to quickly ascertain the nature and gist of a technical disclosure. It is submitted with the understanding that it will not be used to interpret or limit the scope of meaning of the claims.

The invention claimed is:

1. A blocking circuit for suppressing signal components generated by circuit blocks of an integrated circuit chip system from interference with other circuit blocks of the integrated circuit chip system, the blocking circuit configured to couple to an internal power supply providing a power signal to a first circuit block and a second circuit block of the integrated circuit chip system, the blocking circuit comprising:
at least three ports, wherein the at least three ports include:
a first port and a second port configured to couple to a supply line of the internal power supply;
a third port configured to couple to a ground line of the internal power supply; and
at least three frequency responsive admittances coupled to one or more of the at least three ports, the three or more frequency responsive admittances configured to reduce crosstalk effect by suppressing one or more signal components generated by one circuit block of the first and second circuit blocks from interference with the other circuit block; and
wherein an admittance value of at least one frequency responsive admittance of the at least three frequency responsive admittances is configured to increase in response to a decreasing frequency component of the power signal.

2. The blocking circuit of claim 1, wherein a second frequency responsive admittance of the at least three frequency responsive admittances is configured to decrease in response to the decreasing frequency.

3. The blocking circuit of claim 2, comprising:
a first node;
a second node coupled to the third port; and
wherein the at least three frequency responsive admittances include:
the at least one frequency responsive admittance coupled between the first port and the first node;
the second frequency responsive admittance coupled between the first node and the second port; and
a third frequency responsive admittance coupled between the first node and the second node.

4. The blocking circuit of claim 3, wherein an admittance of the third frequency responsive admittance is configured to decrease in response to the decreasing frequency.

5. The blocking circuit of claim 4, wherein the second node is coupled directly to the third port.

6. The blocking circuit of claim 4, wherein the at least three ports includes a fourth port coupled to the ground line; and
wherein the blocking circuit further comprises:
a fourth frequency responsive admittance configured to couple the second node to the third port; and
a fifth frequency responsive admittance configured to couple the second node to the fourth port.

7. The blocking circuit of claim 6, wherein an admittance of the fourth frequency responsive admittance is configured to increase in response to the decreasing frequency; and
wherein an admittance of the fifth frequency responsive admittance is configured to increase in response to the decreasing frequency.

8. The blocking circuit of claim 2, wherein the at least three frequency responsive admittances include:
the at least one frequency responsive admittance coupled between the first port and the second port; and
the second frequency responsive admittance coupled between the first port and the third port.

9. The blocking circuit of claim 8, including a third frequency responsive admittance directly coupled with the second port and directly coupled with the third port.

10. The blocking circuit of claim 8, comprising a fourth port coupled to the ground line; and
a third frequency responsive admittance coupled between the second port and the fourth port.

11. The blocking circuit of claim 10, comprising a fourth frequency responsive admittance coupled between the third port and the fourth port.

12. The blocking circuit of claim 11, wherein an admittance of the fourth frequency responsive admittance is configured to increase with the decreasing frequency.

13. The blocking circuit of claim 11, wherein the at least three frequency responsive admittances include:
a fifth frequency responsive admittance coupled between the first port and the fourth port; and
a sixth frequency responsive admittance coupled between the second port and the third port.

14. The blocking circuit of claim 13, wherein an admittance of the fifth frequency responsive admittance is configured to increase in response to the decreasing frequency; and
wherein an admittance of the sixth frequency responsive admittance is configured to increase in response to the decreasing frequency.

15. An integrated circuit chip system comprising:
a first circuit block including a first frequency generator, a second circuit block including a second frequency generator, the second frequency generator configured to provide a second clock signal having a second frequency, wherein one or more circuits of the second circuit block are configured to receive the second clock signal; and a blocking circuit configured to couple to a supply line and a ground line providing power for the first circuit block and the second circuit block, the blocking circuit comprising:

at least three ports, wherein the at least three ports include:

a first port and a second port configured to couple to a supply line of the internal power supply;

a third port configured to couple to a ground line of the internal power supply; and at least three frequency responsive admittances coupled to one or more of the at least three ports, the three or more frequency responsive admittances configured to reduce crosstalk effect by suppressing signals generated by one circuit block of the first and second circuit blocks from interference with the other circuit block; and wherein an admittance value of at least one frequency responsive admittance of the at least three frequency responsive admittances is configured to increase in response to a decreasing frequency component of the power signal.

16. The integrated circuit chip system of claim 15, wherein a second frequency responsive admittance of the at least three frequency responsive admittances is configured to decrease in response to the decreasing frequency.

17. The integrated circuit chip system of claim 15, wherein the first frequency generator is configured to provide a first clock signal having a first frequency, wherein one or more circuits of the first circuit block are configured to receive the first clock signal; and wherein the second frequency generator configured to provide a second clock signal having a second frequency, wherein one or more circuits of the second circuit block are configured to receive the second clock signal.

18. The integrated circuit chip system of claim 15, wherein the integrated circuit chip system is a system on chip (SoC) system.

19. The integrated circuit chip system of claim 15, wherein the integrated circuit chip system is a Package on Package (PoP) system.

* * * * *